United States Patent
Cima et al.

(10) Patent No.: US 8,896,305 B2
(45) Date of Patent: Nov. 25, 2014

(54) PERMANENT OR VARIABLE ALTERNATING MAGNETIC FIELD CIRCULATION SENSOR, AND CURRENT SENSOR IMPLEMENTING SUCH A SENSOR

(75) Inventors: Lionel Cima, Chatenay-Malabry (FR); Yohan Maniouloux, Grenoble (FR)

(73) Assignee: Neelogy, Cachan (FR)

( * ) Notice: Subject to any disclaimer, the term of this patent is extended or adjusted under 35 U.S.C. 154(b) by 715 days.

(21) Appl. No.: 12/993,835

(22) PCT Filed: May 22, 2009

(86) PCT No.: PCT/FR2009/050953
§ 371 (c)(1),
(2), (4) Date: Feb. 10, 2011

(87) PCT Pub. No.: WO2009/153485
PCT Pub. Date: Dec. 23, 2009

(65) Prior Publication Data
US 2011/0140694 A1    Jun. 16, 2011

(30) Foreign Application Priority Data
May 22, 2008  (FR) ...................... 08 53338

(51) Int. Cl.
*G01R 33/04*  (2006.01)
*G01R 1/06*  (2006.01)
*H01F 38/30*  (2006.01)
*G01R 33/18*  (2006.01)
*G01R 33/06*  (2006.01)

(52) U.S. Cl.
CPC .............. *G01R 33/063* (2013.01); *G01R 33/18* (2013.01); *G01R 33/04* (2013.01)
USPC ............................ 324/253; 324/149; 336/174

(58) Field of Classification Search
USPC .................................................. 324/149, 253
See application file for complete search history.

(56) References Cited

U.S. PATENT DOCUMENTS

| | | | |
|---|---|---|---|
| 4,831,327 A | 5/1989 | Chenier et al. | |
| 5,469,058 A | 11/1995 | Dunnam | |
| 5,815,391 A | 9/1998 | Pelly | |
| 6,566,855 B1 | 5/2003 | Nguyen et al. | |
| 6,693,368 B2 * | 2/2004 | Schumann et al. | 307/10.1 |
| 7,372,261 B2 | 5/2008 | Choi et al. | |
| 2002/0190831 A1 | 12/2002 | Hess et al. | |
| 2004/0201373 A1 | 10/2004 | Kato | |
| 2005/0088662 A1 | 4/2005 | Bohnert et al. | |
| 2005/0134290 A1 | 6/2005 | Sarkozi et al. | |

(Continued)

FOREIGN PATENT DOCUMENTS

FR          2487969        2/1982

*Primary Examiner* — Bot Ledynh
(74) *Attorney, Agent, or Firm* — Greer, Burns & Crain, Ltd.

(57) ABSTRACT

A permanent or variable magnetic field circulation sensor including apparatus for magnetic excitation further including at least one elongated excitation coil extending around an elongated supple magnetic core and including a supple magnetic material with low relative magnetic permeability having a supple or flexible matrix in which magnetic particles are dispersed, an excitation current generation unit coupled to the excitation coil to generate an excitation magnetic field in the core over substantially the entire length of the coil, apparatus for measurement including: at least one magnetic measuring transducer magnetically coupled to the apparatus for magnetic excitation, a measuring unit connected to the magnetic measuring transducer and suitable for providing a measurement of magnetic field circulation in the core.

15 Claims, 5 Drawing Sheets

(56) References Cited

U.S. PATENT DOCUMENTS

| | | |
|---|---|---|
| 2005/0183514 A1 | 8/2005 | Huybrechts et al. |
| 2006/0082356 A1 | 4/2006 | Zhang et al. |
| 2008/0252289 A1* | 10/2008 | Lenglet .................. 324/253 |
| 2008/0303511 A1 | 12/2008 | Grno |

* cited by examiner

PERMANENT OR VARIABLE ALTERNATING MAGNETIC FIELD CIRCULATION SENSOR, AND CURRENT SENSOR IMPLEMENTING SUCH A SENSOR

The present invention relates to the technical field of sensors used to measure magnetic magnitudes such as the magnetic field in order to find an intrinsic value for the latter, or to extrapolate from it values quantifying the physical phenomena at its origin. In a preferred but non-exclusive application, the invention relates to current sensors which determine the intensity of an electrical current circulating in a conductor from the magnetic field radiated by the latter.

Thus, some sensors such as current sensors of the Rogowski type determine the value of a current from the circulation of the magnetic field generated by said current in a transducer, also called a Rogowski probe. Such a Rogowski type transducer generally comprises an elongated coil extending around an elongated supple core constituted by a non-magnetic material. The Rogowski transducer is then connected to electronics which determine, from the electrical magnitudes measured at the terminals of the coil, the value of the magnetic flux circulating inside said coil to deduce from it, when the coil surrounds an electrical conductor, the intensity of the current circulating in the conductor.

Such Rogowski sensors are satisfactory for measuring alternating currents but nevertheless have the disadvantage of not being suitable for measuring direct currents. In order to remedy this disadvantage, it has been proposed, by patent application US 2004/0201373, to implement a sensor comprising a detection element of the flux gate type with high magnetic permeability as well as a magnetic core formed by a tape made from a material with high magnetic permeability which surrounds the detection element of the flux gate type. However, the implementation of the magnetic material with high relative magnetic permeability implies recourse to particularly costly magnetic alloys which are sensitive to external mechanical stresses. The need therefore arose for a new type of sensor suitable for measuring alternating currents and direct currents which has a reduced production cost in comparison with sensors using materials with high permeability which are less sensitive to external mechanical stresses and thus less fragile than known sensors.

In order to achieve this objective, the invention relates to a magnetic field circulation sensor comprising:
  means of magnetic excitation comprising:
  at least one elongated excitation coil extending around an elongated supple magnetic core and constituted by a supple magnetic material with a low relative magnetic permeability and comprising a supple or flexible matrix in which magnetic particles are dispersed,
  an excitation current generation unit coupled to the excitation coil in order to generate an excitation magnetic field in the core over substantially the entire length of the coil,
  means of measurement comprising:
  at least one magnetic measurement transducer magnetically coupled to the means of magnetic excitation, and
  a measuring unit connected to the measurement transducer and suitable for exploiting the electrical magnitudes originating from the measurement transducer.

It should be noted that the sensor according to the invention is a circulation sensor, i.e. the measuring means are suitable for integrating the value of the magnetic field along the core or at least over the length of the core covered by the excitation coil.

The implementation of means of magnetic excitation makes it possible to generate an excitation magnetic field in the core which will be modulated by the magnetic field to be measured owing to the magnetic non-linearities introduced by the magnetic particles of the magnetic core with low relative magnetic permeability. The circulation of the modulated magnetic field will be determined by the measuring means, which integrate the values of the magnetic field along the elongated magnetic core. Owing to this excitation, the sensor according to the invention is sensitive to the circulations of magnetic fields, both permanent and variable.

Furthermore, the implementation of a magnetic core comprising a supple matrix in which magnetic particles are dispersed makes it possible to obtain a sensor which is not very, or not at all, sensitive to mechanical stresses or deformations undergone by its core.

Also, it should be emphasised that the inventors have demonstrated that it is possible to detect or measure magnetic fields as well as permanent variable magnetic fields by implementing materials with low relative magnetic permeability, whereas, up to now, materials with high relative magnetic permeability have been used, as described by application US 2004/0201373.

According to a characteristic of the invention, the particles of the core of the transducer have sub-micrometric dimensions and preferably of nanometric order. The implementation of such a particle size makes it possible to obtain a low or very low core permeability as well as a diminution in hysteresis, a reduction in sensitivity to air gaps and an increase in the operating range of the sensor prior to saturation of the sensor. It is important to state that, unlike sensors of the flux gate type, particles with sub-micrometric dimensions are selected to introduce modulation through their non-linearities, without necessarily saturating the material of the magnetic core. Thus, the magnetic field circulation sensor increases its linear operating range, i.e. in the presence of two sources of external fields, the magnetic field circulation sensor provides information proportionate to the sum of the two external magnetic field circulations. Similarly, according to another characteristic of the invention, the particles of the core of the transducer form aggregates which have sub-micrometric dimensions and preferably of nanometric order.

According to yet another characteristic of the invention, the core has superparamagnetic behaviour. The implementation of such a superparamagnetic core has the advantage of making use of the substantially complete absence of hysteresis, which makes it possible to increase the accuracy of the sensor with respect to low field circulation values.

According to the invention, the excitation coil can be produced in various ways. Thus, the excitation coil can comprise a conductor wound around the core in contiguous turns or otherwise, the ends of the conductor connection then each being located at a different end of the elongated body. These ends are then brought closer together so that they can be connected to the excitation unit and/or to the measuring unit when the core is closed upon itself so as to surround the electrical conductor or conductors in which a current to be measured circulates. Of course, such an embodiment of the excitation coil is not strictly necessary or even the only one which can be envisaged.

Thus, according to an embodiment of the invention, the excitation coil comprises at least one outgoing conductor wound around the core so as to extend from a first end to a second end of the core and at least one return conductor extending from the second end of the outgoing conductor to return to the vicinity of the first end.

According to a variant of this embodiment, the return conductor extends in the core substantially along its central axis Δ. Thus, the outgoing conductor, the core and the conductor exhibit a coaxial geometry which is particularly suited to automated industrial manufacture.

According to another variant of this embodiment, the return conductor is wound around the core. This winding of the return conductor makes it possible to increase the excitation field. The return conductor will then be wound in order to prevent a neutralisation of the excitation field generated by the outgoing conductor by the excitation field generated by the return conductor. Also, the return conductor will preferably form the same number of turns as the outgoing conductor and will preferably also be wound with the same pitch, whether the turns are contiguous or not.

According to the invention, the measuring means can be produced in any appropriate manner. Thus, the measuring means can comprise several Hall effect transducers distributed in the core and connected to the measuring unit so as to integrate the local values of the magnetic field into the latter. The Hall effect transducers will preferably be uniformly distributed in the core to provide for homogeneous integration of the magnetic field. Of course, it would be possible to envisage other types of discrete magnetic transducers such as magneto-resistances, for example.

According to an embodiment of the invention, the magnetic measuring transducer comprises at least one conductor wound around the elongated supple magnetic core. The implementation of such a transducer continuously distributed along the magnetic core 11 makes it possible to bring about a continuous integration of the magnetic field in the core, which contributes, among other things, to the accuracy and linearity of the sensor.

According to a characteristic of this embodiment, the excitation coil forms in part at least the magnetic measuring transducer. It is thus possible to reduce the production costs of the sensor according to the invention.

According to another characteristic of this embodiment, the measuring transducer comprises at least one measuring coil distinct from the excitation coil and formed by a measuring conductor wound around the core. Preferably, the measuring coil extends over the same portion of the magnetic core as the excitation coil. The use of a measuring coil distinct from the excitation coil has the advantage that substantially no current then circulates in the measuring coil, thus making it possible to overcome the parasitic effects of the winding resistance in determining the circulation of the magnetic field.

According to a characteristic of the invention, each wound conductor forms turns which are each spaced from the next one by a distance less than or equal to 4 times the diameter of the conducting wire constituting the winding and preferably by a distance less than or equal to twice the diameter of the conducting wire. Such winding parameters make it possible, within the framework of the excitation coil, to obtain a good homogeneity of the excitation field in the core. As part of the measurement, these parameters make it possible to provide for a more homogeneous integration of the magnetic field along the core and thus to increase the sensitivity of the circulation sensor according to the invention.

According to another characteristic of the invention, at least one wound conductor forms contiguous turns. As part of the measurement, this characteristic corresponds to a configuration providing for homogeneous integration of the magnetic field over the entire length of the measuring transducer and thus provides for a measurement of the circulation of the magnetic field in the core without any discontinuity.

According to yet another characteristic of the invention, the sensor comprises means for generating a feedback field that is suitable for maintaining a substantially zero magnetic field circulation in the magnetic core, and connected to a coil of the sensor.

The feedback means can then be connected to the excitation coil or also to another coil which surrounds the core and extends substantially over the entire length of the excitation coil. The implementation of such feedback means is particularly advantageous in reducing the effect of temperature on the performance of the magnetic field circulation sensor.

According to yet another characteristic of the invention, the sensor comprises means for measuring the temperature in order to compensate for the effect of the latter.

According to a characteristic of the invention aimed at providing for differential measurements, the magnetic field circulation sensor comprises at least two assemblies with substantially identical geometries, each formed by a combination of an excitation coil, a magnetic core and a measuring transducer and preferably two assemblies only.

According to another characteristic of the invention, the sensor comprises at least four substantially identical assemblies, each formed by a combination of an excitation coil, a magnetic core and a measuring transducer. The implementation of four excitation and measuring assemblies makes it possible to take a measurement with the transducers based on a Wheatstone bridge.

The substantially identical assemblies can then be placed in different planes, which are not necessarily parallel to one another. In an embodiment variant, at least some and preferably all the assemblies are substantially parallel to one another.

According to yet another characteristic of the invention, the sensor comprises at least one Rogowski type transducer connected to the measuring unit. Such a Rogowski type transducer comprises, for example, at least one elongated coil which extends around an elongated supple non-magnetic core and which is connected to the measuring means. Preferably, but not strictly necessary, the Rogowski transducer will be arranged substantially parallel to the magnetic excitation transducer. The implementation of such a Rogowski type transducer in a circulation sensor according to the invention makes it possible for the latter to measure the circulation of high-frequency variable fields with a greater passband. Thus, the sensor according to the invention is suitable for accurately measuring the circulation of low- or high-frequency variable fields and permanent fields.

According to yet another characteristic of the invention, the magnetic field circulation sensor comprises means of connection between the transducers and the excitation and measuring units. Preferably, but not strictly necessary, these means of connection are reversible so as to permit several successive connections and disconnections of the transducers to and from the excitation and measuring units and, possibly, the feedback means.

According to a characteristic of the invention, the circulation sensor comprises means for loop closure of the magnetic core. Such means of closure then provide for keeping the opposite ends of the core close together in order, for example, to surround in part at least an electrical conductor or a set of electrical conductors in order to measure the circulation of the magnetic field produced by one or more circulating electrical currents, as can be useful in current measurement applications.

The invention also relates to a direct- or variable-current sensor implementing a magnetic field circulation sensor according to the invention with measuring means which are suitable for measuring a current circulating in a conductor around which the assembly formed by the excitation coil and the core is loop closed.

Of course, the different characteristics, forms and variant embodiments of the invention can be combined together in various combinations in so far as they are not incompatible with one another or mutually exclusive.

Also, various other characteristics of the invention are apparent from the description given below with reference to the attached diagrams, which illustrate non-limitative embodiments of a magnetic field circulation sensor according to the invention and transducers constituting such a sensor.

In the Figures, the different elements common to the different variants or embodiments have the same references.

Figure 1:
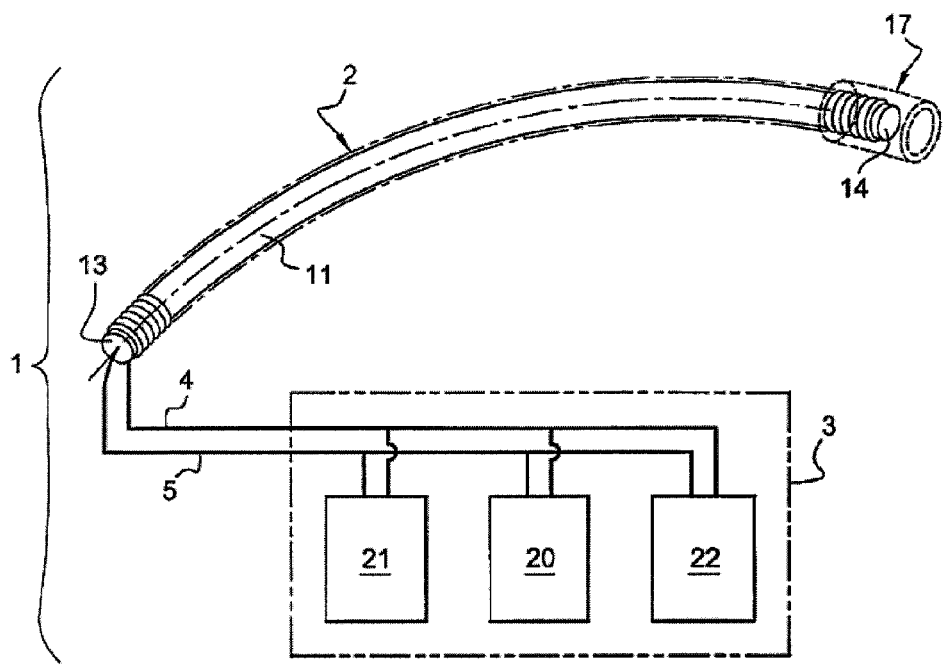
FIG. 1 is a diagrammatic perspective of a sensor according to the invention implementing a single magnetic core.

A magnetic field circulation sensor according to the invention, as shown diagrammatically in FIG. 1 and designated as a whole by reference 1, comprises, on the one hand, a transduction assembly 2 and, on the other hand, an electronics unit 3 connected by electrical wires or cables 4, 5 to the transduction assembly 2.

The transduction assembly 2 comprises an elongated coil 10 wound around a magnetic core 11. Within the meaning of the invention, by elongated coil is meant a coil with a length greater than twice its diameter and, for example, a length greater than five times or even ten times the diameter of the coil. Preferably, the coil will extend over the major part of the magnetic core. Thus, the magnetic core 11 has a length equal to or greater than that of the coil 10. In order to facilitate the production of the transduction assembly 2 but also to make the implementation of the sensor easier, the magnetic core 11 has a supple character at least prior to its first implementation. By supple character is meant that the core 11 is supple or flexible at ambient temperature (20° C.) and can therefore be deformed by hand without any special tools. According to the invention, the magnetic core 11 is then constituted by a supple material including a supple or flexible matrix made from a polymer material in which magnetic particles are dispersed which impart their magnetic nature to the core.

The supple matrix can then be implemented, according to the applications envisaged for the sensor according to the invention, either of a plastic material also called a plastomer or of natural or synthetic rubber also called an elastomer. The matrix can thus be made from a plastic material selected from thermoplastic or thermosetting materials. By way of example, the matrix can be selected from the following thermosetting materials: phenoplast, aminoplast, epoxy resin, unsaturated polyester, cross-linked polyurethane alkyl. The matrix can also be selected from the following thermoplastic materials: polyvinyl, polyvinyl chloride, polyvinyl acetate, polyvinylic alcohol, polyester and copolymer, acrylic polymer, polyolefin, cellulose derivative, polyamide. The matrix can also be selected from the following polymers: fluorinated polymer, silicone, synthetic rubber, saturated polyester, linear polyurethane, polycarbonate, polyacetal, polyphenylene oxide, polysulfone, polyester sulfone, phenylene polysulfide, polyimide and elastomer.

In order to facilitate the manufacture and implementation of the coil, the material constituting the matrix will selected preferably to exhibit a flexible nature throughout the service life of the sensor. However, it could be envisaged to implement for the matrix a material which can subsequently be hardened or made rigid so as to become substantially undeformable following installation of the transducer in its place of usage. Thus, it could be envisaged to use as a matrix a thermosetting material undergoing, after implementation of the coil, a heat treatment to give it a particular shape, possibly being elastically deformable.

In order to impart a magnetic character to the core, the material constituting the latter also comprises magnetic particles dispersed inside the matrix. The magnetic particles will be selected, for example, from particles of iron oxide, particles of a mixed oxide of iron and another metal, particles of nickel or cobalt oxide or mixed oxides of these metals. The mixed iron oxides are, for example, mixed oxides of iron and another metal selected from Mn, Ni, Zn, Bi, Cu, Co. The magnetic particles could also be selected from iron oxide particles of the $Fe_3O_4$ and/or $F_2O_3$ type. The magnetic particles could also be selected from particles of metal alloy of the $Fe_xNi_{(1-x)}$, $Co_xNi_{(1-x)}$ or $Fe_{20}Ni_{80}$ type.

In order to impart particular isotropic magnetic properties such as low relative permeability, for example, less than 100, or even less than 10, or even less than 5, or such as a non-linearity prior to saturation and a low hysteresis, the particles of the core will be selected to exhibit, individually or in aggregate, sub-micrometric dimensions and preferably of nanometric order. Preferably, the magnetic particles will be selected so as to exhibit dimensions and concentrations in the matrix imparting to the core a superparamagnetic behaviour. By superparamagnetic behaviour is meant a superparamagnetic behaviour as defined by Etienne du Tremolet de Lacheisserie et al in "Magnetism" VOLUME 1, published in 1999 by "EDP Sciences" in the collection "Grenoble Sciences", ISBN 2-86883-463-9.

According to the example shown, the coil 10 comprises an outgoing conductor 12 which extends from a first end 13 of the core to the opposite end or second end 14. The outgoing conductor 12 is wound in contiguous turns around and along the core 11. In order to facilitate the connection of the coil 10 to the unit 3, the coil 10 comprises a return conductor 15, which extends the outgoing conductor 12 from the end 14 to the first end 13.

According to the example shown, the return conductor 15 extends in the core substantially along the central axis or middle fibre Δ of the latter. Of course, it could be envisaged to have the return conductor return to the outside of the core or of the coil, extending substantially parallel to the central axis Δ. In order to provide protection for the coil and more particularly its winding 12, the latter can be covered with a protective sheathing 16, which might, for example, be constituted by supple sheathing made from a thermoretractable material. The core-coil assembly 2 also comprises, according to the example shown, means 17 of loop closure formed here by a suitable tubular sleeve at end 14 intended to receive the end 13. Of course, the means of closure 17 could be implemented in any other appropriate way, such as, for example, in the form of a mechanical fastener providing for a large number of openings and closings.

As indicated above, the coil 10 is connected to the unit 3 which comprises means of excitation 20 and measuring means 21. The means of excitation 20 comprise electronics which generate an excitation current so as to bring about an excitation magnetic field in the core 11 and over the entire length of the coil 10. In so far as, according to the example shown, the means of excitation 20 are directly connected to the single coil 10, the excitation magnetic fields brought about by the excitation current generated by the means 20 necessarily extend at least over the entire length of the coil. Also, the measuring means 21 are connected to the coil 10 in parallel to the means of excitation 20. The measuring means 21 are then suitable for exploiting the electrical magnitudes originating from the latter.

Figure 3:
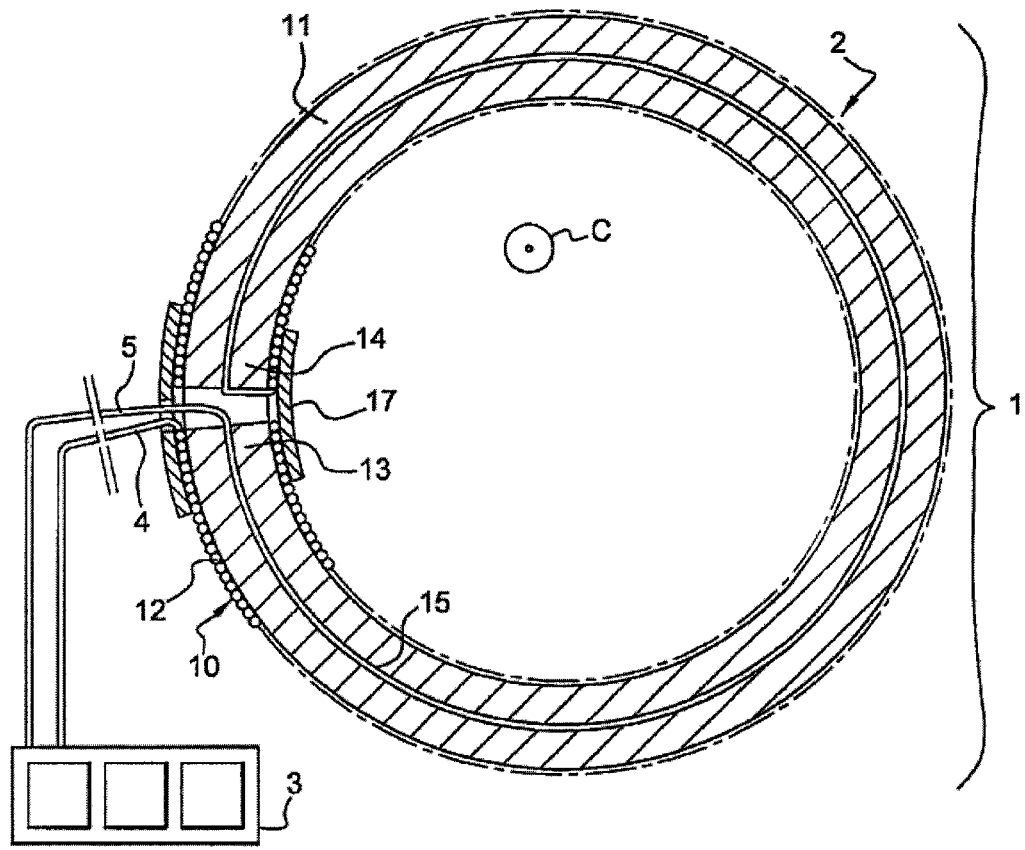
FIG. 3 is a diagrammatic cross section of the sensor shown in FIG. 1 where the transducer or core-coil assembly is loop closed around an electrical conductor so as to form a current sensor.

In a preferred but non-exclusive embodiment, the measuring means 21 are suitable for determining the intensity of a current circulating in a conductor C from the magnetic field radiated by the latter and circulating in the coil 10. To this end, the transducer 2 is, preferably and as shown in FIG. 3, loop closed around the conductor C inside which the current to be measured circulates. This loop closure is performed by engaging the end 13 of the core-coil assembly 2 in the sleeve 17 fitted to the end 14. Of course, other means of closure could be implemented to position the core-coil assembly 2 around the conductor C.

It should be noted that, within the framework of the embodiment of the sensor 1 described previously, the coil 10 performs a double function of measurement and excitation coil. Furthermore, it could also be envisaged to implement feedback means 22 suitable for keeping the magnetic field in the core 11 at a value of substantially zero. In the case shown in FIGS. 1 to 3, these feedback means 22 are connected directly to the coil 10, which then performs a third function of feedback coil.

Figure 4:
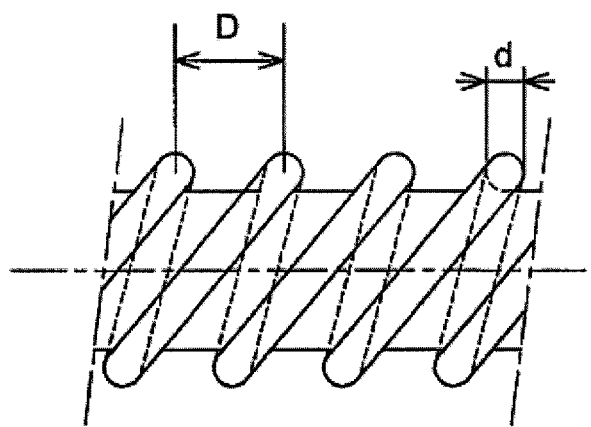
FIG. 4 is a partial axial section of a transducer according to the invention showing a constructional characteristic of the latter.

According to the example shown, the coil 10 comprises a conductor wound in contiguous turns. However, according to the invention, the turns of the conductor 12 need not be contiguous, as shown in FIG. 4.

Preferably, two consecutive turns will then be spaced at a distance D less than four times the diameter d of the conductor constituting the winding and preferably less than twice this diameter.

Figure 2:
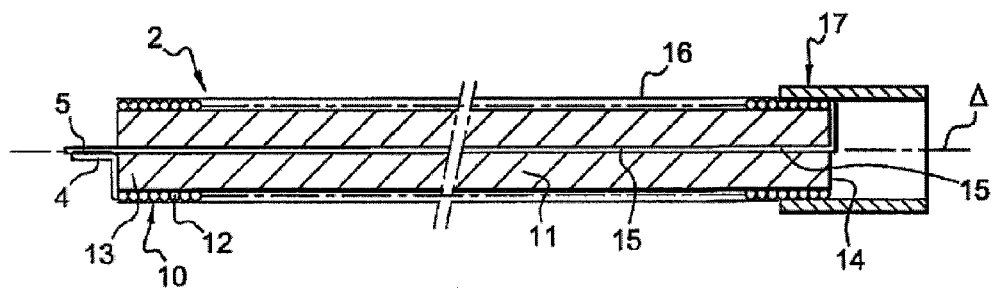
FIG. 2 is a longitudinal section of the transducer or the core-coil assembly constituting the sensor shown in FIG. 1.
Figure 5:
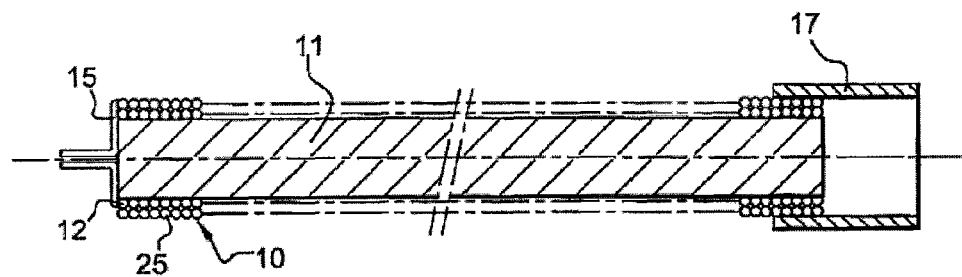
FIGS. 5 to 9 show variant embodiments of a transducer constituting a sensor according to the invention.

According to the example described in relation to FIGS. 1 to 3, the return conductor 15 extends to the centre of the core 11. However, such an implementation method is not strictly necessary to obtain a transducer 2 according to the invention. Thus, FIG. 5 shows another embodiment of the core-coil assembly 2 and more particularly of a coil 10, according to which the return conductor 15 is wound around the core 11 and the conductor 12 to form a return winding 25 which comprises the same number of turns as the "outgoing" conductor 12. The turns of the winding 25 or the return conductor 15 are then wound in the same direction. Such an implementation method can also be envisaged in the case where the coil 10 has an even number of windings, namely as many "outgoing" windings as "return" windings.

Figure 6:
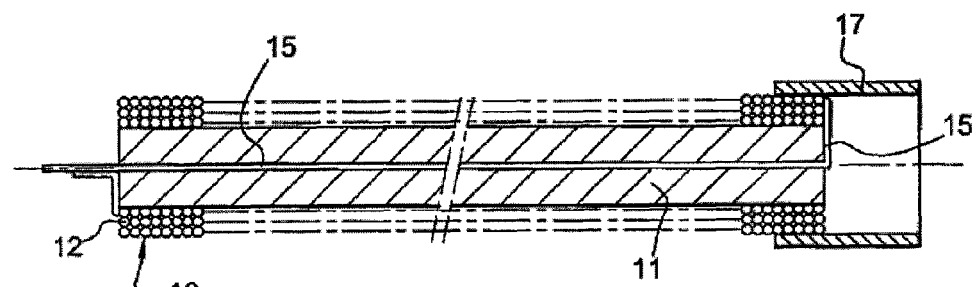

Of course, the coil 10 could comprise an odd number of windings greater than or equal to three, as shown in FIG. 6. According to this example, the coil 10 comprises three windings, the last of which is connected at the level of the end 14 to the return conductor 15, which extends inside the core 11.

According to the example shown in relation to FIGS. 1 to 3, the transduction assembly 2 comprises a single coil, which performs the functions of excitation and measurement and possibly also feedback. However, the functions of excitation and measurement are not necessarily performed by one and the same coil.

Figure 7:
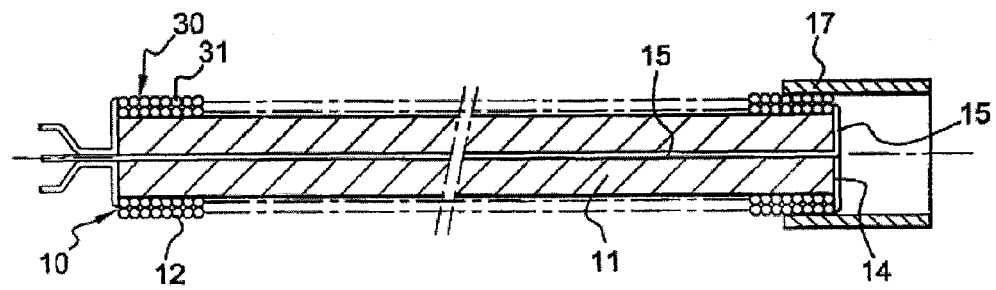

Thus, FIG. 7 shows a transduction assembly 2 according to the invention which comprises both an excitation coil 10 and a measurement coil 30 surrounding the excitation coil 10. According to this example, the excitation coil 10 comprises a single "outgoing" winding or conductor 12 and a return conductor 15. Similarly, the measurement coil 30 comprises a single winding 31 connected at the level of the end 14 to the return conductor 15.

Figure 8:
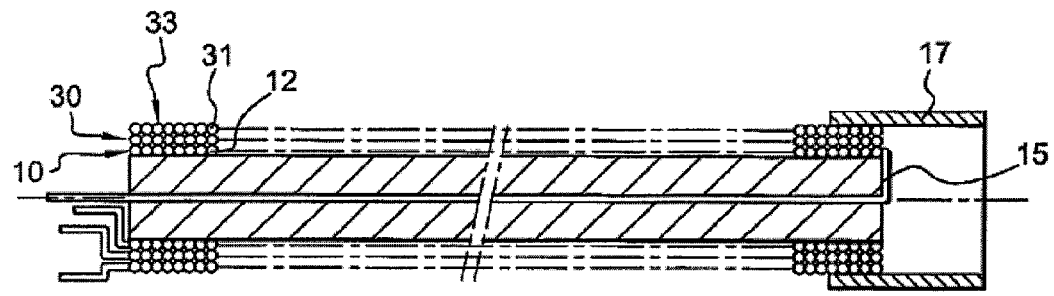
Figure 9:
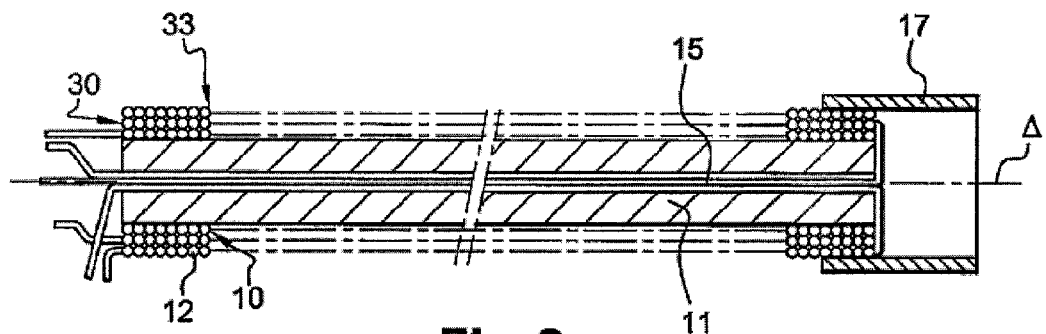

Of course, it could also be envisaged, as shown in FIG. 8, to have a third coil 33 wound around the coils 10 and 30 and intended to form a feedback coil. According to the example shown, the three coils 10, 30 and 33 share the same return conductor 15. On the other hand, according to the example shown in FIG. 9, each of the coils 10, 30, 33 has its own return conductor extending into the core 11 substantially along the central axis Δ of the latter.

Figure 10:
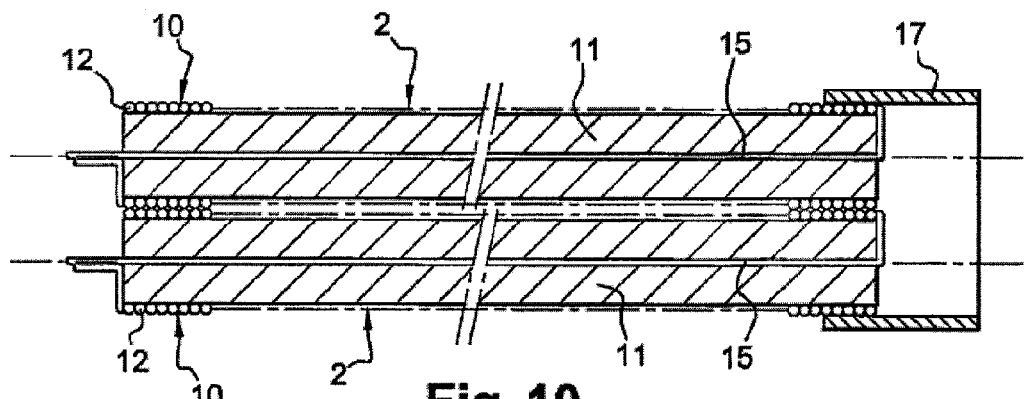
FIGS. 10 and 11 show in longitudinal section the combination of respectively two and four transducers or core-coil assemblies according to the invention parallel to one another and intended to be integrated with a magnetic field circulation sensor according to the invention.

A magnetic field circulation sensor can comprise a single transduction assembly 2 or, as shown in FIG. 10, several, in this case two, identical transduction assemblies 2, which are arranged so as to be parallel to one another. Such an arrangement makes it possible to perform differential measurements.

Figure 11:
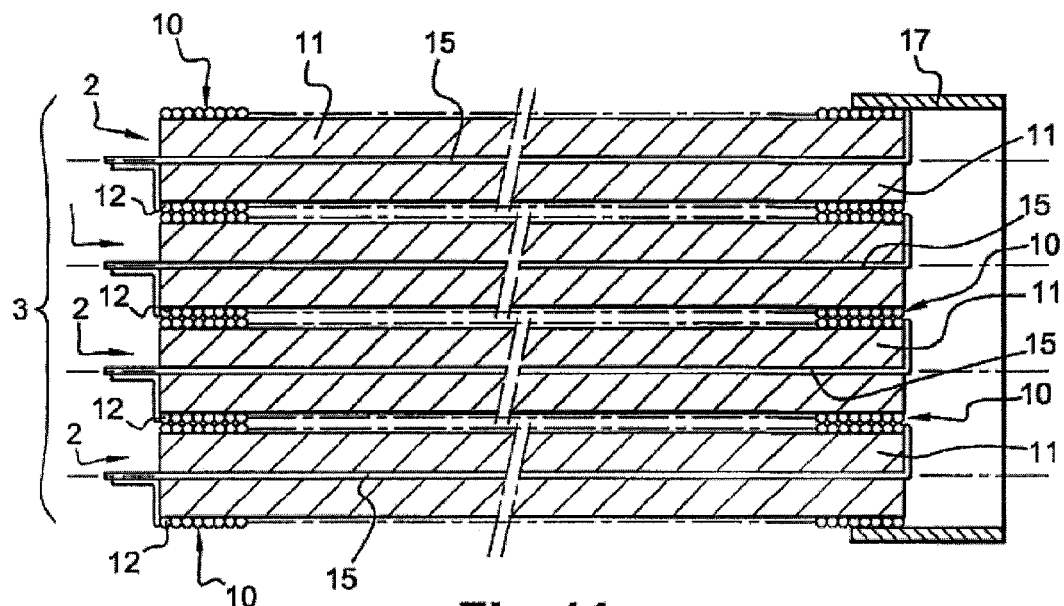

Similarly, FIG. 11 shows a combination of four identical transduction assemblies 2 arranged so as to be parallel to one another. This combination makes it possible to use the transducers to perform a measurement based on a Wheatstone bridge.

Figure 12:
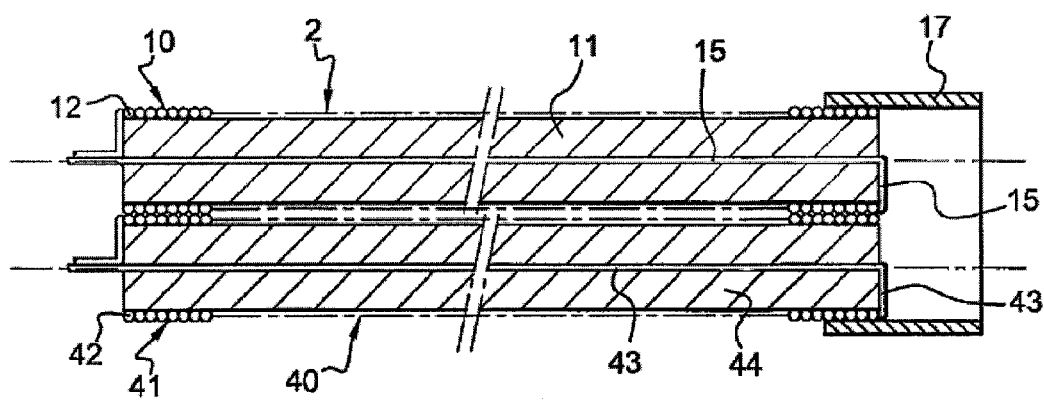
FIG. 12 is a partial longitudinal section of a transducer arranged parallel to a Rogowski type transducer so as to be integrated with a magnetic field circulation sensor according to the invention.

It is also possible to combine a transduction assembly or transducer 2 according to the invention with a non-magnetic transducer 40, as shown in FIG. 12. The non-magnetic transducer 40 then exhibits a general mechanical structure substantially similar to that of the transduction assembly 2 with a coil 41 comprising a wound outgoing conductor 42 and a return conductor 43. The amagnetic transducer 40 differs from the magnetic transducer 2 in that its core 44 is non-magnetic and that it is not necessarily excited. The transducer 40 then resembles a Rogowski type probe or transducer. The transducer 2 and the Rogowski type transducer 40 are both connected to the measuring means 21 while only the magnetic transducer 2 is connected to the means of excitation 20. It should be noted that the transducers 2 and 40 are both suitable for measuring magnetic field circulation, the terms magnetic and non-magnetic being adopted here with respect to the nature of the core.

Of course, various other modifications can be made to the invention within the context of the attached claims.

The invention claimed is:

1. A permanent or variable magnetic field circulation sensor comprising:
   a magnetic excitation apparatus comprising:
      at least one elongated excitation coil extending around an elongated supple magnetic core, said excitation coil being constituted by a supple magnetic material with low relative magnetic permeability comprising a supple or flexible matrix in which magnetic particles are dispersed;
      an excitation current generation unit coupled to the excitation coil in order to generate an excitation magnetic field in the core over substantially the entire length of the coil;

a measurement device including:

at least one magnetic measuring transducer magnetically coupled to the magnetic excitation apparatus; and a measuring unit connected to the magnetic measuring transducer and suitable for providing a measurement of magnetic field circulation in the core.

2. The sensor according to claim 1, wherein the relative magnetic permeability of the magnetic core is less than 100 or less than 10 or less than 5.

3. The sensor according to claim 1, wherein the magnetic particles of the core have sub-micrometric dimensions.

4. The sensor according to claim 2, wherein the core has a superparamagnetic behavior.

5. The sensor according to claim 1, wherein the excitation coil comprises at least one outgoing conductor wound around the core so as to extend from a first end to a second end of the core and at least one return conductor extending from the second end of the outgoing conductor to return to the vicinity of the first end.

6. The sensor according to claim 5, wherein the return conductor extends within the core substantially along its central axis.

7. The sensor according to claim 1, wherein the magnetic measurement transducer comprises at least one conductor wound around the elongated supple magnetic core.

8. The sensor according to claim 1, wherein the excitation coil forms in part at least the magnetic measurement transducer.

9. The sensor according to claim 1, wherein at least one wound conductor forms contiguous turns.

10. The sensor according to claim 1, further comprising a feedback device suitable for maintaining the circulation of the field within a predefined range.

11. The sensor according to claim 1, further comprising at least two substantially identical assemblies, each formed of an excitation coil, a magnetic core and a linked measuring transducer.

12. The sensor according to claim 1, further comprising at least one transducer connected to the measuring unit.

13. The sensor according to claim 1, further comprising closure means for closing a loop of the magnetic core.

14. The sensor according to claim 1, further comprising connection means for connecting the transducer, the excitation apparatus and the measuring unit.

15. A direct or alternating current sensor, implementing a permanent or variable magnetic field circulation sensor according to claim 1, wherein the measuring device is suitable for measuring a current circulating in a conductor around which the assembly formed by a loop of the excitation coils and the core is closed.

\* \* \* \* \*